(12) United States Patent  
Lee et al.

(10) Patent No.: US 9,287,444 B2  
(45) Date of Patent: Mar. 15, 2016

(54) DEVICES HAVING NITRIDE QUANTUM DOT AND METHODS OF MANUFACTURING THE SAME

(71) Applicants: SAMSUNG ELECTRONICS CO., LTD., Suwon-si (KR); KOREA PHOTONICS TECHNOLOGY INSTITUTE, Gwangju (KR)

(72) Inventors: Jae-soong Lee, Suwon-si (KR); Young-ho Song, Gwangju (KR); Seong-ran Jeon, Gwangju (KR); Seung-hwan Kim, Gwangju (KR)

(73) Assignees: SAMSUNG ELECTRONICS CO., LTD., Suwon-si (KR); KOREA PHOTONICS TECHNOLOGY INSTITUTE, Gwangju (KR)

( * ) Notice: Subject to any disclaimer, the term of this patent is extended or adjusted under 35 U.S.C. 154(b) by 0 days.

(21) Appl. No.: 14/492,594

(22) Filed: Sep. 22, 2014

(65) Prior Publication Data

US 2015/0263225 A1 Sep. 17, 2015

(30) Foreign Application Priority Data

Mar. 14, 2014 (KR) ......................... 10-2014-0030460

(51) Int. Cl.  
*H01L 33/32* (2010.01)  
*H01L 33/06* (2010.01)  
(Continued)

(52) U.S. Cl.  
CPC ............ *H01L 33/06* (2013.01); *H01L 33/0025* (2013.01); *H01L 33/0075* (2013.01); *H01L 33/24* (2013.01); *H01L 33/32* (2013.01); *H01L 33/502* (2013.01); *H01L 2933/0041* (2013.01)

(58) Field of Classification Search  
CPC . H01L 33/0025; H01L 33/0075; H01L 33/06; H01L 33/24; H01L 33/32; H01L 33/502  
USPC ................................................. 257/13; 438/47  
See application file for complete search history.

(56) References Cited

U.S. PATENT DOCUMENTS 8,017,415 B2 9/2011 Zimmerman et al.  
8,338,853 B2 12/2012 Kiyama et al.  
(Continued)

FOREIGN PATENT DOCUMENTS

KR 10-2013-0077600 A 7/2013  
WO 01/80311 A1 10/2001

OTHER PUBLICATIONS

M. Gherasimova, G. Cui, S.-R. Jeon, Z. Ren, D. Marlos, J. Han, Y. He, and A. V. Nurmikko; "Droplet heteroepitaxy of GaN quantum dots by metal-organic chemical vapor deposition"; Applied Physics Letters; vol. 85; No. 12; Sep. 20, 2004; pp. 2346-2348; doi: 10.1063/1.1793343.

(Continued)

*Primary Examiner* — Daniel Shook  
(74) *Attorney, Agent, or Firm* — Sughrue Mion, PLLC

(57) ABSTRACT

Devices having nitride quantum dots and methods of manufacturing the same are provided. The device includes a nitride group material substrate, a plurality of nanorods that are formed on the nitride group material layer and are separated from each other, and a nitride quantum dot on each of the nanorods. A pyramid-shaped layer may be further formed between each of the nanorods and the nitride quantum dot. The nanorods and the nitride quantum dot are covered by an upper contact layer. A plurality of nitride quantum dots may be formed on each of the nanorods and the respective nitride quantum dots may have different sizes.

19 Claims, 5 Drawing Sheets

(51) Int. Cl.
*H01L 33/24* (2010.01)
*H01L 33/00* (2010.01)
*H01L 33/50* (2010.01)

(56) References Cited

U.S. PATENT DOCUMENTS

2011/0126891 A1* 6/2011 Goto et al. .................. 136/255
2015/0097193 A1* 4/2015 Yap ............................... 257/76

OTHER PUBLICATIONS

Chih-Wei Hsu, Anders Lundskog, K. Fredrik Karlsson, Urban Forsberg, Erik Janzen, and Per Olof Holtz; "Single Excitons in InGaN Quantum Dots on GaN Pyramid Arrays"; Nano Letters; vol. 11; 2011; pp. 2415-2418.

Jheng-Tai Yan, Chia-Hsun Chen, Shiu-Fang Yen, and Ching-Ting Lee; "Ultraviolet ZnO Nanorod/P—GaN-Heterostructured Light-Emitting Diodes"; IEEE Photonics Technology Letters; vol. 22; No. 3; Feb. 1, 2010; pp. 146-148.

\* cited by examiner

DEVICES HAVING NITRIDE QUANTUM DOT AND METHODS OF MANUFACTURING THE SAME

RELATED APPLICATIONS

This application claims priority from Korean Patent Application No. 10-2014-0030460, filed on Mar. 14, 2014 in the Korean Intellectual Property Office, the disclosure of which is incorporated herein in its entirety by reference.

BACKGROUND

1. Field

Apparatuses and method consistent with exemplary embodiments relate to devices that use quantum dots as a light source, and more particularly, to devices that include nitride quantum dots and methods of manufacturing the same.

2. Description of the Related Art

The formation of self-assembling quantum dots is the only method for manufacturing a zero dimension electronic apparatus, and has been the subject of much interest in the field of semiconductors. A method mainly used for forming quantum dots is the Stransski-Kranstanov (S-K) growing method.

However, the S-K growing method is subject to many restrictions when manufacturing quantum dots. For example, in the S-K method, either a free standing aluminum nitride (AlN) template substrate having significant compression may be used or a non-compressed AlN template substrate may be used. However, because AlN is an insulator, it is difficult to apply it to an optical device.

SUMMARY

One or more exemplary embodiments provide devices having nitride quantum dots that may be readily applied to an optical device and may increase the efficiency of optical extractions.

One or more exemplary embodiments also provide methods of manufacturing nitride quantum dots.

According to an aspect of an exemplary embodiment, there is provided a device including: a nitride group material substrate; a plurality of nanorods that are disposed on the nitride group material layer and are separated from each other; and a plurality of nitride quantum dots disposed on the nanorods.

The device may further include pyramid-shaped layers interposed between the nanorods and the nitride quantum dots.

The nanorods and the nitride quantum dots may be covered by an upper contact layer.

A plurality of nitride quantum dots may be formed on each of the nanorods, and the nitride quantum dots may have different sizes.

The pyramid shape layers may include a same metal that is included in the nitride quantum dot.

The nitride group material substrate may include Ga.

The nitride quantum dots may include Ga.

The nanorods may have a lattice constant similar to that of the nitride group material substrate.

The nanorods may be ZnO nanorods.

According to an aspect of another exemplary embodiment, there is provided a method of manufacturing a device, the method including: forming a plurality of nanorods on a nitride group material substrate; forming a metal thin film on the nanorods layers; transforming the metal thin film to metal quantum dots; and nitrifying the metal quantum dots.

The forming the nanorods may include: forming a mask layer on the nitride group material substrate; forming a plurality of through holes through which the nitride group material substrate is exposed on the mask layer; and filling the through holes with a material layer to form the nanorods in the through holes.

The forming the nanorods and forming the metal thin film may include: forming a lattice matching layer on the nitride group material substrate; forming a metal thin film on the lattice matching layer; separating a stack of the metal thin film and the lattice matching layer into a plurality of patterns; and filling gaps between the separated patterns with an insulating layer.

The transforming the metal thin film to metal quantum dots may include annealing the metal thin film.

The nitrifying the metal quantum dots may include controlling a formation condition of ammonia with respect to the metal quantum dots.

The method may further include forming an upper contact layer covering the nitrified metal quantum dots and the nanorods.

The nanorods may be ZnO nanorod layers.

The nitride quantum dots may include Ga.

According to an aspect of another exemplary embodiment, there is provided a method of manufacturing a device, the method including: forming a plurality of nanorods on a nitride group material substrate; forming pyramid shape material layers on the nanorods, and forming a plurality of nitride quantum dots on top portions of the pyramid shape material layers.

The forming the pyramid shape material layer may include growing a material layer on each of the nanorods by applying a pyramid shape formation condition.

The forming the nitride quantum dots on the top portions of the pyramid shape material layers may include supplying a source of the material layer together with an ammonia gas when the top portions of the pyramid shape material layers are formed.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
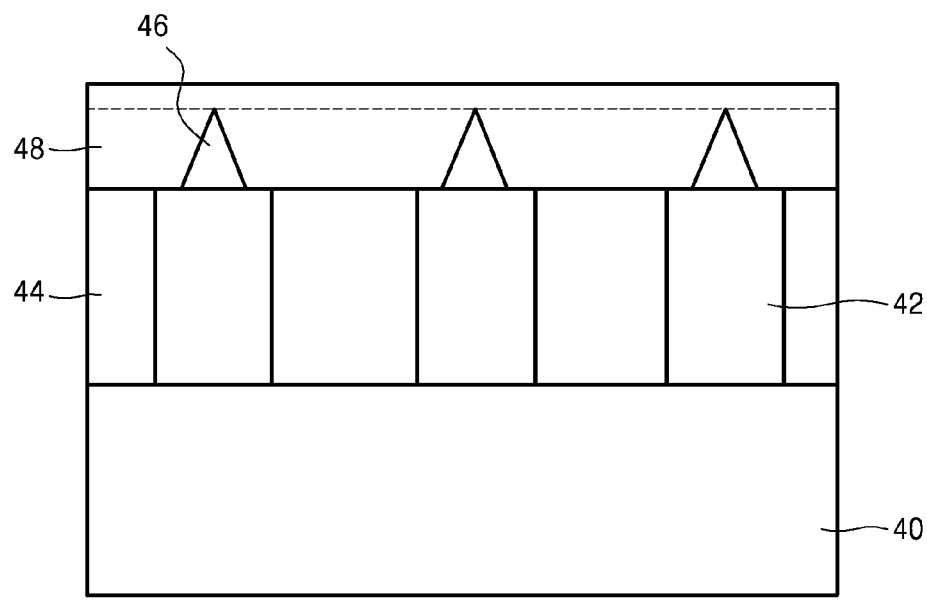
FIG. 1 is a cross-sectional view of a device having nitride quantum dots according to an exemplary embodiment.

A device having nitride quantum dots and a method of manufacturing the same according to exemplary embodiments will now be described in detail with reference to the accompanying drawings. In the drawings, the thicknesses of layers and regions may be exaggerated for clarity.

First, a device having nitride quantum dots according to an exemplary embodiment will be described. The device described below may be an optical device.

FIG. 1 is a cross-sectional view of a device having nitride quantum dots according to an exemplary embodiment.

Referring to FIG. 1, a plurality of nanorods 42 that are separated from each other are formed on a substrate 40. Each of the nanorods 42 has a predetermined diameter and height. The height of the nanorods 42 may be greater than the diameter thereof. An interlayer material 44 is filled between the nanorods 42. The interlayer material 44 may be an insulating material. The substrate 40 may be a nitride group material substrate, for example, a GaN substrate, but is not limited thereto. The nanorods 42 may be formed from a material having a lattice constant and refractive index similar to those of the substrate 40. Accordingly, both the lattice mismatch between the substrate 40 and the nanorods 42 and Fresnel reflection may be reduced, and thus, the device's efficiency of optical extraction may be increased. The nanorods 42 may be, for example, zinc oxide nanorods. A nitride quantum dot 46 may be formed on a region of an upper surface of the layer of nanorods 42. The nitride quantum dot 46 may be, for example, a GaN quantum dot, but is not limited thereto. The nanorods 42 and the nitride quantum dot 46 are covered by an upper contact layer 48. The upper contact layer 48 may also cover the interlayer material 44 between the nanorods 42. One of the functions of the upper contact layer 48 is to provide a stable contact. The upper contact layer 48 may be a nitride group material layer, for example, an AlGaN layer or an InGaN layer, but is not limited thereto. The height of an upper surface of the upper contact layer 48 may be equal to or higher than an edge of the nitride quantum dot 46 (represented by the dashed line in FIG. 1). In other words, the thickness of the upper contact layer 48 may be equal to or greater than the height of nitride quantum dot 46.

Figure 2:
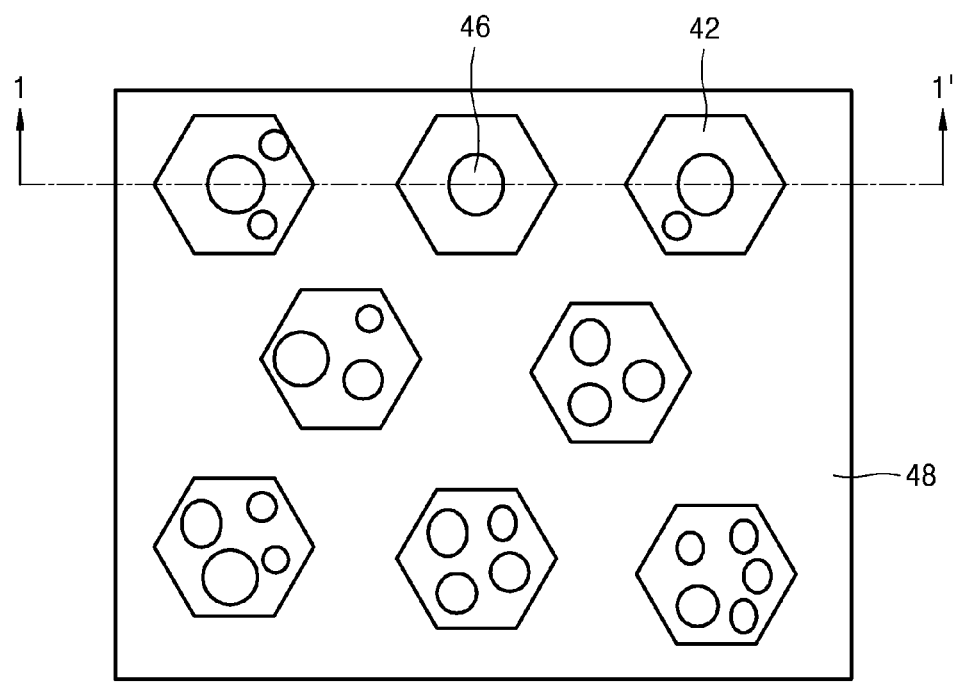
FIG. 2 is a plan view of a device having nitride quantum dots according to an exemplary embodiment.

FIG. 2 is a plan view of a device having nitride quantum dots according to an exemplary embodiment.

FIG. 1 is a cross-sectional view taken along a line 1-1' of FIG. 2.

Referring to FIG. 2, the nanorods 42 are distributed on the substrate 40. The nanorods 42 are randomly distributed in FIG. 2, but the nanorods 42 may be distributed in a regular or ordered arrangement. The plane shape of the nanorods 42 may have a hexagonal cross-sectional shape. One or a plurality of nitride quantum dots 46 may be formed on an upper surface of each of the nanorods 42. When a plurality of nitride quantum dots 46 are formed on the upper surface of each of the nanorods 42, the size of the nitride quantum dots 46 may be the same or different from each other. The cross-sectional shape of the nitride quantum dot 46 is depicted in FIG. 2 as circular, but it may be another shape, for example, hexagonal or elliptical.

Figure 3:
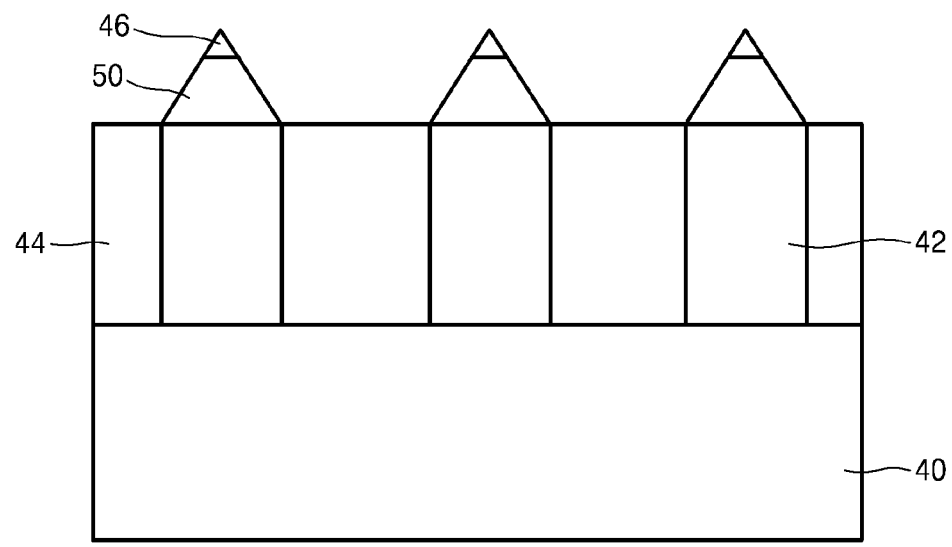
FIG. 3 is a cross-sectional view of a device having nitride quantum dots according to another exemplary embodiment.

FIG. 3 is a cross-sectional view of a device having nitride quantum dots 46 according to another exemplary embodiment.

Referring to FIG. 3, a Ga layer 50 is formed on an upper surface of each of the nanorods 42. The Ga layer 50 has a pyramid shape. An edge or top portion of the Ga layer 50 is the nitride quantum dot 46. In FIG. 3, the nitride quantum dot 46 is a nitride on the edge portion of the Ga layer 50.

Although not shown in FIG. 3, the Ga layer 50 and the nitride quantum dot 46 may be covered by a contact layer such as the upper contact layer 48 shown and discussed above with reference to FIG. 1.

Figure 4:
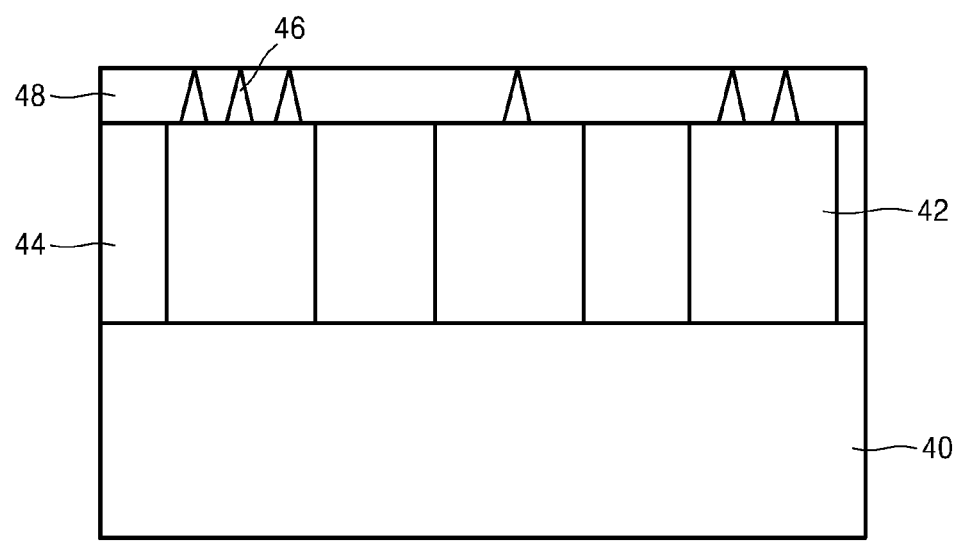
FIG. 4 is a cross-sectional view of a device in which different numbers of nitride quantum dots are formed on each of the nanorods, according to an exemplary embodiment.

FIG. 4 is a cross-sectional view of a device in which different numbers of nitride quantum dots 46 are formed on each of nanorods 42, according to an exemplary embodiment.

Referring to FIG. 4, three nitride quantum dots 46 are formed on the nanorod 42 on the left, a single nitride quantum dot 46 is formed on the nanorod 42 in the middle, and two nitride quantum dots 46 are formed on the nanorod 42 on the right.

Although a limited number of nanorods 42 are shown in FIGS. 1 through 4, embodiments are not limited thereto, and the limited number of nanorods 42 are shown for the sake of convenience. Accordingly, an additional number of nanorods 42, above what is depicted in the drawings, may be included on the substrate 40.

Figure 5:
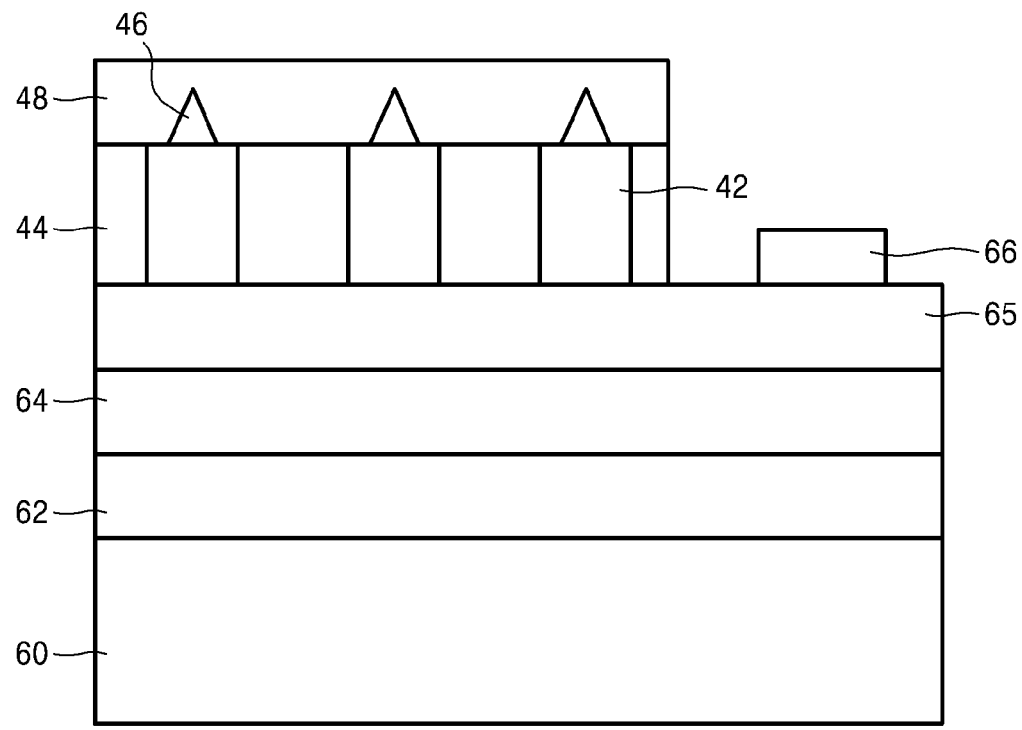
FIG. 5 is a cross-sectional view of a light-emitting device to which a device having nitride quantum dots according to an exemplary embodiment is applied.

FIG. 5 is a cross-sectional view of a light-emitting device to which a device having the nitride quantum dots 46 according to an exemplary embodiment is applied.

Referring to FIG. 5, a first semiconductor layer 62, an active layer 64, and a second semiconductor layer 65 are sequentially formed on a base substrate 60. The first semiconductor layer 62 may be, for example, an N-type compound semiconductor layer. The N-type compound semiconductor layer may be, for example, an n-GaN layer. The active layer 64 is a region where light is generated by the combination of electrons and holes, and may be, for example, a multiple quantum well (MQW) layer. The second semiconductor layer 65 may be, for example, a P-type compound semiconductor layer. The P-type compound semiconductor layer may be, for example, a p-GaN layer. The second semiconductor layer 65 may be the substrate 40 as shown in, for example, FIG. 1. A stacking structure having a plurality of nanorods 42, the nitride quantum dot 46, and the upper contact layer 48, which are described above with reference to FIG. 1, may be formed on the second semiconductor layer 65. Light generated from the active layer 64 is emitted through the plurality of nanorods 42 and the nitride quantum dot 46. An electrode 66 is formed on the second semiconductor layer 65. The electrode 66 is a p-type electrode and is separated from the stacking structure that is formed on the second semiconductor layer 65.

Next, a method of manufacturing a device having the nitride quantum dot 46 according to an exemplary embodiment will be described with reference to FIGS. 6 and 7.

Figure 6:
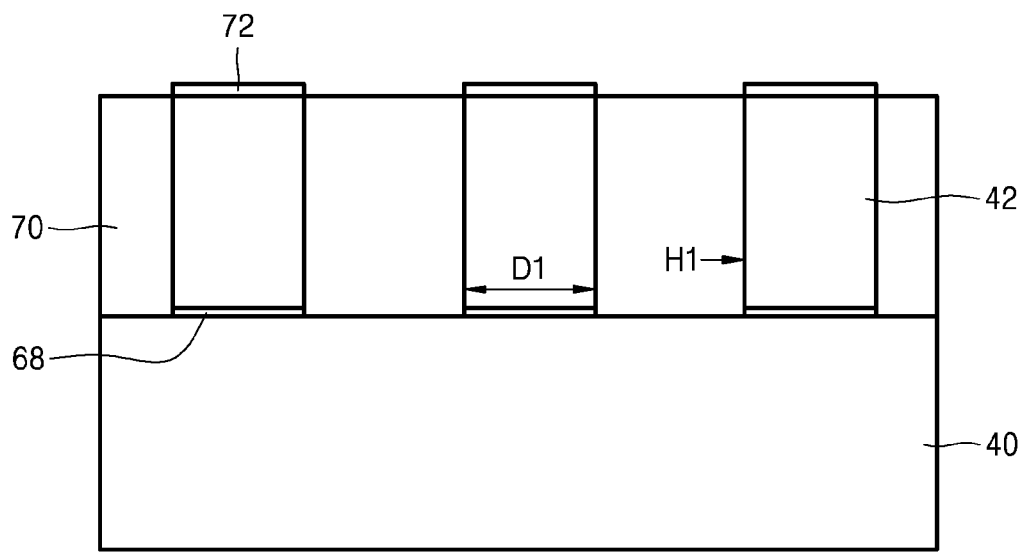
FIGS. 6 and 7 are cross-sectional views illustrating a method of manufacturing a device having nitride quantum dots according to an exemplary embodiment.

Referring to FIG. 6, a mask layer 70 is formed on the substrate 40. The substrate 40 may be a nitride substrate, for example, a GaN substrate. The mask layer 70 may be an insulating layer or a photosensitive layer. The mask layer 70 is formed so as to define a region of the substrate 40 on which the plurality of nanorods 42 will be formed. A plurality of through holes H1 are formed in the mask layer 70. An upper surface of the substrate 40 is exposed through the through holes H1. The diameter of the nanorods 42 to be formed in a subsequent process is determined according to the diameter (D1) of the through holes H1, and the nitride quantum dot 46 to be formed on the nanorod layer 42 is affected by the diameter of the nanorod layer 42. Thus, the above points are considered when forming the through holes H1. After the through holes H1 are formed, a seed layer 68 is formed on the surface of the substrate 40 that is exposed through the through holes H1. The seed layer 68 may be, for example, an AlGaInN layer. The nanorods 42 are grown in the through holes H1 by using the seed layer 68 as a seed. The growing of the nanorods 42 is performed until the through holes H1 are filled with the nanorods 42. When the nanorods 42 are grown higher than an upper surface of the mask layer 70, the corresponding portions may be removed by using a planarizing process, such as etch-back or CMP. The nanorods 42 may be grown by using a general epitaxial method. The nanorods 42 may be made from a material having a lattice constant similar to that of the substrate 40 such that a lattice mismatch with the substrate 40 is minimized. The nanorods 42 may be, for example, ZnO nanorods. The substrate 40 is covered by the mask layer 70, with the exception of the through holes H1, and thus during the process of growing the nanorods 42, the nanorods 42 are not grown on regions other than the regions defined by the through holes H1. After the nanorods 42 are grown, a quantum dot is formed on an exposed upper surface of each nanorod 42. The quantum dot may be formed by using a metal droplet method. More specifically, first, a metal thin film 72 may be formed on the nanorods 42. The metal thin film 72 may be formed to a predetermined thickness, for example, in a range of from about 1 nm to about 100 nm. Since the nanorods 42 are surrounded by the mask layer 70, the metal thin film 72 may be selectively formed on the nanorods 42. The metal thin film 72 may be formed from the metal included in the quantum dot. For example, when the quantum dot is formed from GaN, the metal thin film 72 may be a Ga film. The metal thin film 72 may be a single thin film or a binary thin film. In the case of a single thin film, the metal thin film 72 may be a Ga thin film. In the case of a binary thin film, the metal thin film 72 may be, for example, an InGa thin film. After the metal thin film 72 is formed, it is annealed at a predetermined temperature. For example, the annealing temperature may be in a range from about 500° C. to about 1,200° C. The metal thin film 72 agglomerates according to the annealing temperature that is used. Therefore, a metal quantum dot having a desired size may be formed at a desired position by appropriately controlling the annealing temperature. As a result, a single metal quantum dot may be formed on each nanorod 42 by controlling the growing condition of the nanorod 42 and by controlling the annealing temperature of the metal thin film 72, and a single nitride quantum dot 46 may be formed on the nanorod 42 via a subsequent nitration process. In such a way, a single photon source may be formed.

In this way, after the metal quantum dot is formed by the metal droplet method, the metal quantum dot is nitrated. As a result, as depicted in FIG. 7, the nitride quantum dots 46 are formed on the nanorods 42. The shape, size, and density of the finally-formed nitride quantum dots 46 may be controlled by controlling the nitration conditions. The nitration conditions include the formation conditions of ammonia (or the condition of a gas atmosphere of ammonia) (for example, pressure, temperature, concentration, annealing time, pulse condition, or the like).

Figure 7:
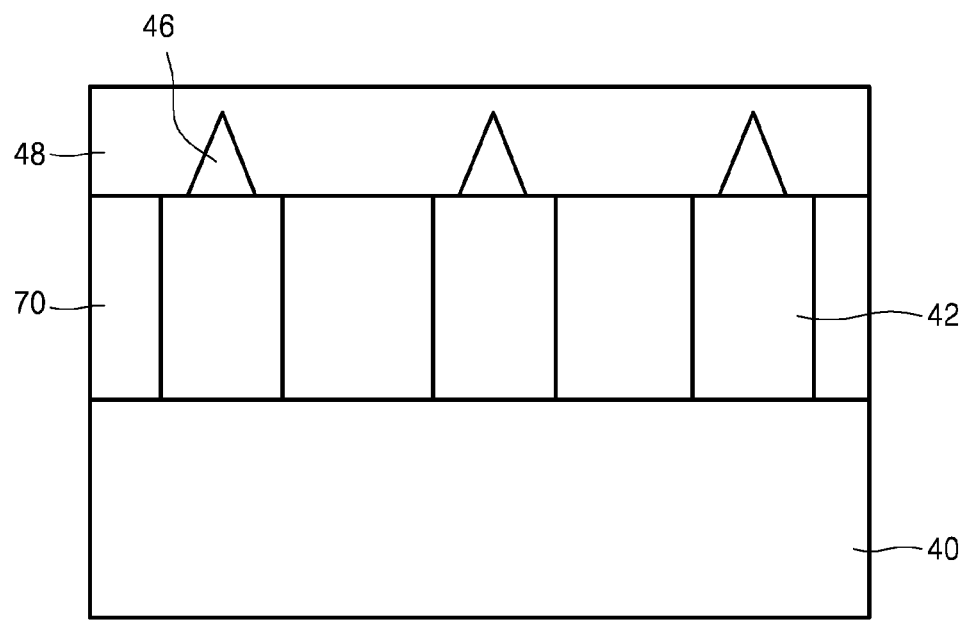

Referring to FIG. 7, after the nitride quantum dots 46 are formed, the upper contact layer 48 may be formed on the nanorods 42 to provide for stable contact. The upper contact layer 48 may be, for example, an AlGaN layer or an InGaN layer. The upper contact layer 48 may be formed by using a growing method. The upper contact layer 48 may be formed in a lateral direction overgrowth condition or a condition in which a growing speed in a horizontal direction is faster than in a vertical direction. In this way, the upper contact layer 48, that covers the nanorods 42 and the nitride quantum dot 46 and the mask layer 70, may be formed. The upper surface of the upper contact layer 48 may be at a height equal to or higher than the top of the nitride quantum dot 46.

In FIG. 6, instead of forming the metal thin film 72 on the layer of nanorods 42, a Ga layer 50 having a pyramid shape may be formed, as depicted in FIG. 3. The Ga layer 50 having a pyramid shape may be formed by growing a Ga layer under a pyramid shape growing condition. When an edge portion, that is, the top portion of the Ga layer 50 having a pyramid shape is formed, a Ga source is supplied together with ammonia gas. As a result, the edge portion of the Ga layer 50 is formed so as to be the nitride quantum dot 46, that is, a GaN layer.

As another method, a plurality of nitride quantum dots may be formed on the nanorod layers 42 by controlling the annealing temperature in the metal droplet method.

Also, when the nitride quantum dot 46 is formed, the composition content of the nitride quantum dot 46 may be controlled. In this way, the wavelength of light emitted from the nitride quantum dot 46 may be controlled so as to be a single wavelength or multiple wavelengths. Accordingly, a white light emitting diode (LED) may also be manufactured by using the nitride quantum dot 46.

Also, since the lattice constant and the refractive index of the nanorods 42 are similar to those of the nitride substrate 40, the Fresnel reflection at the interface between the nanorods 42 and the nitride substrate 40 may be reduced, and thus, the efficiency of the device's optical extraction may be increased.

Next, a method of manufacturing the nitride quantum dot 46 according to another exemplary embodiment will be described with reference to FIGS. 8 through 10. In this description, like reference numerals are used to indicate elements that are substantially identical to the elements described above, and detailed descriptions thereof will not be repeated.

Figure 8:
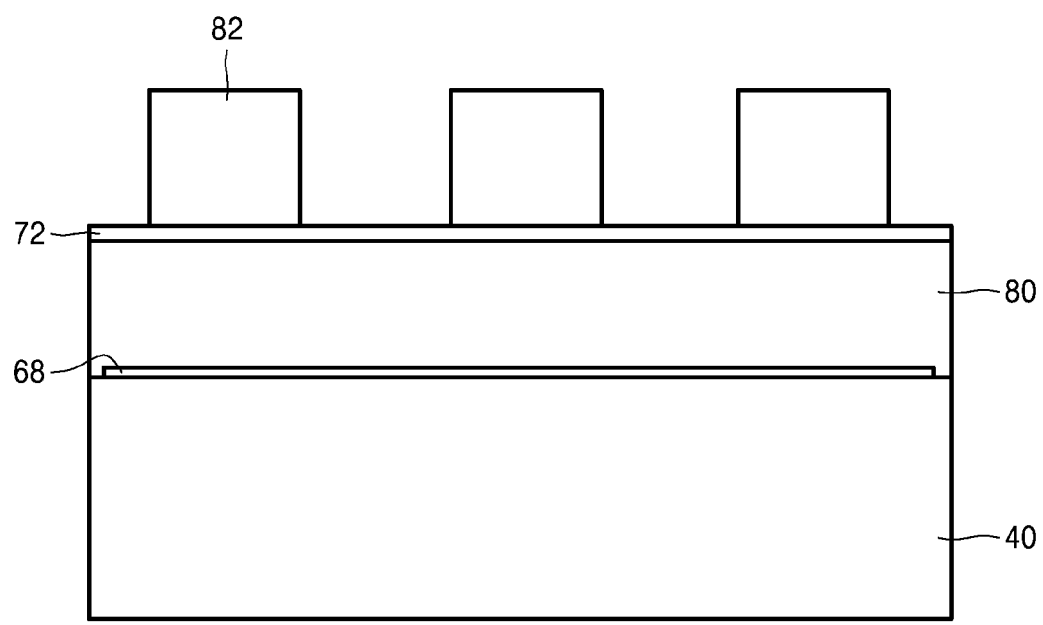
FIGS. 8, 9, and 10 are cross-sectional views illustrating a method of manufacturing a device having nitride quantum dots according to another exemplary embodiment.
Figure 9:
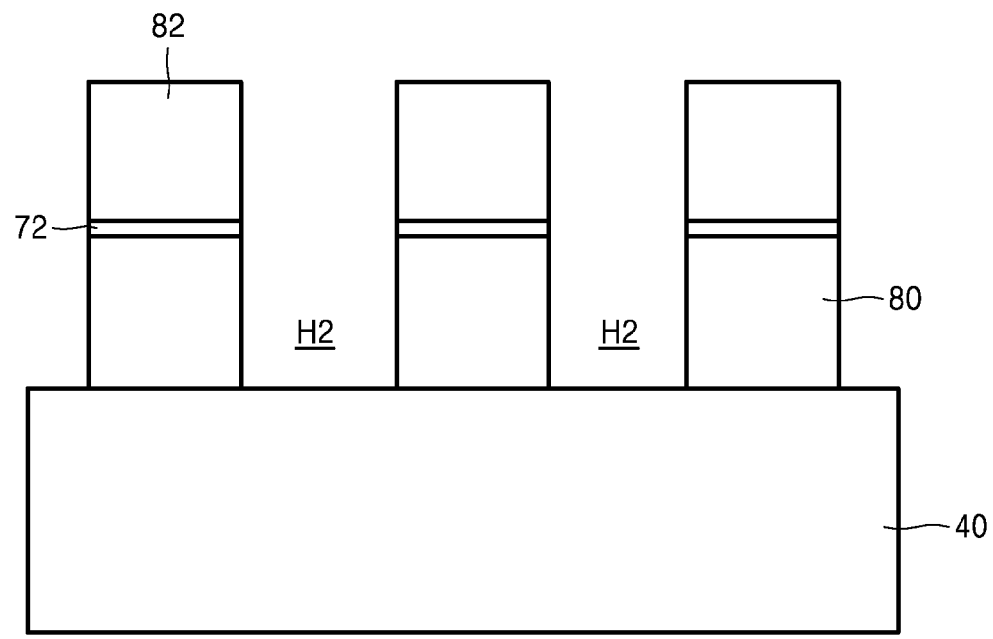

Referring to FIG. 8, the seed layer 68 is formed on the substrate 40. A lattice-matching layer 80 is formed on the substrate 40 by using the seed layer 68 as a nucleus. The lattice-matching layer 80 may have a lattice constant similar to that of the substrate 40. The lattice-matching layer 80 may be the same material layer as the nanorods 42 of FIG. 6. The lattice-matching layer 80 may be grown by using an epitaxial method. The metal thin film 72 is formed on the lattice-matching layer 80. A mask 82 is formed on the metal thin film 72. The mask 82 may be, for example, a photosensitive film pattern. The mask 82 defines a region where nanorods, such as the nanorods 42 of FIG. 6, may be formed. After the mask 82 is formed, the metal thin film 72 and the lattice-matching layer 80 that are formed around the mask 82 are sequentially etched. The etching may be an anisotropic etching and may be performed until the substrate 40 is exposed. As a result, as depicted in FIG. 9, a plurality of through holes H2 are formed in the lattice-matching layer 80 through which an upper surface of the substrate 40 is exposed. After the through holes H2 are formed, the mask 82 is removed.

Figure 10:
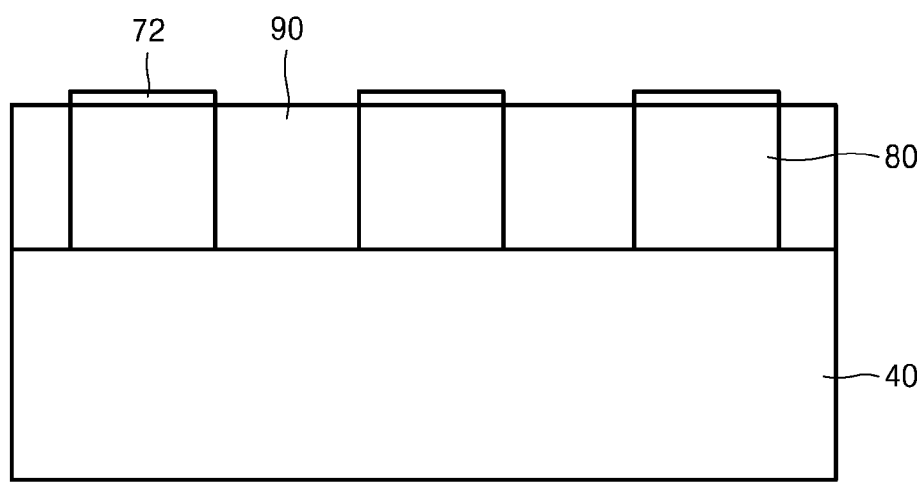

After the mask 82 is removed, as depicted in FIG. 10, the through holes H2 are filled with an insulating layer 90.

The subsequent processes for transforming the metal thin film 72 to a metal quantum dot and for forming the nitride quantum dot may be the same processes described above with reference to FIGS. 6 and 7.

In manufacturing a device having a nitride quantum dot according to an embodiment, a nanorod having a lattice constant similar to that of a nitride thin film (with minimized lattice mismatching) is formed on the nitride thin film, and afterwards, a nitride quantum dot is formed on the nanorod. As a result, the device may be readily applied to a nitride-based optical device (for example, an LED or a 3D hologram TV). Also, when a quantum dot is formed on the nanorod layer by using the metal droplet method, the position, size, and density of the quantum dot may be controlled. Accordingly, the device according to an embodiment may be used as a single photon source, and may also expand the number of optical devices that use a quantum dot as a light source.

In addition, since the nitride thin film and the nanorods have similar lattice constants and refractive indices, the Fresnel reflection at the interface between the nitride thin film and the nanorod may be reduced, thus leading to increased optical extraction efficiency in the device. Further, the wavelength of light emitted from the device may be controlled by controlling the composition content of the nitride quantum dot, and thus, LEDs having not only a single wavelength, but also having multiple wavelengths may be realized according to the present disclosure. Hence, the present disclosure provides for the manufacture of a white LED.

While exemplary embodiments have been described with reference to the figures, it will be understood by those of ordinary skill in the art that various changes in form and details may be made therein without departing from the spirit and scope of the inventive concept as defined by the following claims.

What is claimed is:

1. A device comprising:
   a nitride group material substrate;
   a plurality of nanorods that are disposed on the nitride group material substrate and are separated from each other; and
   a plurality of nitride quantum dots which are disposed on and in direct contact with the nanorods.

2. The device of claim 1, further comprising an upper contact layer covering the nanorods and the nitride quantum dots.

3. The device of claim 1, wherein at least two nitride quantum dots of the plurality of nitride quantum dots are disposed on each of the nanorods and the at least two nitride quantum dots have different sizes.

4. The device of claim 1, wherein the nitride group material substrate comprises Ga.

5. The device of claim 1, wherein the nitride quantum dots comprise Ga.

6. The device of claim 1, wherein the nanorods are ZnO nanorods.

7. A device comprising:
   a nitride group material substrate;
   a plurality of nanorods that are disposed on the nitride group material substrate and are separated from each other;
   a plurality of nitride quantum dots disposed on the nanorods; and
   a plurality of pyramid-shaped layers, wherein each of the plurality of pyramid-shaped layers is interposed between each of the nanorods and each of the nitride quantum dots.

8. The device of claim 7, wherein each of the pyramid-shaped layers comprises a metal that also comprises the nitride quantum dots.

9. A method of manufacturing a device, the method comprising:
   forming a plurality of nanorods on a nitride group material substrate;
   forming a metal thin film on the nanorods;
   transforming the metal thin film into metal quantum dots; and
   nitrifying the metal quantum dots.

10. The method of claim 9, wherein the forming the plurality of nanorods comprises:
    forming a mask layer on the nitride group material substrate;
    forming a plurality of through holes through which the nitride group material substrate is exposed on the mask layer; and
    filling the through holes with a material to form the nanorods in the through holes.

11. The method of claim 9, wherein the forming the plurality of nanorods and the forming the metal thin film comprise:
    forming a lattice matching layer on the nitride group material substrate;
    forming the metal thin film on the lattice matching layer;
    separating a stack of the metal thin film and the lattice matching layer into a plurality of patterns; and
    filling gaps between the separated patterns with an insulating layer.

12. The method of claim 9, wherein the transforming the metal thin film into the metal quantum dots comprises annealing the metal thin film.

13. The method of claim 9, wherein the nitrifying the metal quantum dots comprises controlling a formation condition of ammonia with respect to the metal quantum dots.

14. The method of claim 9, further comprising forming an upper contact layer covering the nitrified metal quantum dots and the nanorods.

15. The method of claim 9, wherein the nanorods are ZnO nanorods.

16. The method of claim 9, wherein the nitride quantum dots comprise Ga.

17. A method of manufacturing a device, the method comprising:
    forming a plurality of nanorods on a nitride group material substrate;
    forming pyramid-shaped material layers on the nanorods; and
    forming nitride quantum dots on top portions of the pyramid-shaped material layers.

18. The method of claim 17, wherein the forming the pyramid-shaped material layers comprises growing a material layer on each of the nanorods by applying a pyramid shape formation condition.

19. The method of claim 18, wherein the forming the nitride quantum dots on the top portions of the pyramid-shaped material layers comprises supplying a source of the material layer together with an ammonia gas when the top portion of the pyramid-shaped material layers are formed.

* * * * *